US006962521B2

(12) United States Patent
Mizushima

(10) Patent No.: US 6,962,521 B2
(45) Date of Patent: Nov. 8, 2005

(54) EDGE POLISHED WAFER, POLISHING CLOTH FOR EDGE POLISHING, AND APPARATUS AND METHOD FOR EDGE POLISHING

(75) Inventor: Kazutoshi Mizushima, Fukushima (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 0 days.

(21) Appl. No.: 10/332,312

(22) PCT Filed: Jul. 6, 2001

(86) PCT No.: PCT/JP01/05888

§ 371 (c)(1), (2), (4) Date: Jan. 8, 2003

(87) PCT Pub. No.: WO02/05337

PCT Pub. Date: Jan. 17, 2002

(65) Prior Publication Data

US 2003/0153251 A1 Aug. 14, 2003

(30) Foreign Application Priority Data

Jul. 10, 2000 (JP) ....................................... 2000-208459

(51) Int. Cl.[7] .................................................. B24B 9/06

(52) U.S. Cl. .......................................... 451/44; 451/533

(58) Field of Search ............................ 451/44, 43, 255, 451/256, 533, 544

(56) References Cited

U.S. PATENT DOCUMENTS 5,914,053 A 6/1999 Masumura et al.
6,250,995 B1 * 6/2001 Hakomori .................... 451/66
6,361,405 B1 * 3/2002 David et al. .................. 451/41
6,808,641 B2 10/2004 Tonami et al.

FOREIGN PATENT DOCUMENTS

| | | |
|---|---|---|
| EP | 0 776 030 A2 | 5/1997 |
| EP | 0813 931 B1 | 12/1997 |
| JP | 08-197400 A1 | 8/1996 |
| JP | 09-150366 A1 | 6/1997 |
| JP | 09-312274 A1 | 12/1997 |
| JP | 11-188590 A1 | 7/1999 |
| JP | 11-277408 A1 | 10/1999 |
| WO | 99/07518 A1 | 2/1999 |

OTHER PUBLICATIONS

International Search Report for International Application No. PCT/JP01/05888 mailed on Oct. 16, 2001.
International Preliminary Examination Report for PCT/JP01/05888 mailed on Jul. 10, 2003.

* cited by examiner

*Primary Examiner*—Robert A. Rose
(74) *Attorney, Agent, or Firm*—Rader, Fishman & Grauer PLLC

(57) ABSTRACT

Provided are a novel edge polished wafer in which a wafer peripheral sag is suppressed, a polishing cloth, a polishing apparatus and a polishing method for processing the wafer. The wafer is provided by controlling an over-polish width in edge polishing to 400 μm or less. Also, the polishing cloth has a multi-layer structure of at least two layers including a polishing fabric layer an Asker C hardness of which is 65 or higher and a sponge layer an Asker C hardness of which is 40 or lower, or a single layer structure of the polishing fabric layer. Further, the polishing apparatus and the polishing method are provided by edge polishing such that the wafer in rotation is put into contact with a rotary drum having the polishing cloth adhered thereon at a prescribed angle thereto while supplying polishing slurry to the contact portion of the polishing cloth.

11 Claims, 12 Drawing Sheets

EDGE POLISHED WAFER, POLISHING CLOTH FOR EDGE POLISHING, AND APPARATUS AND METHOD FOR EDGE POLISHING

TECHNICAL FIELD

The present invention relates to an edge polished wafer with a suppressed sag in the outer peripheral portion thereof, to a polishing cloth for edge polishing, and to an apparatus and method for edge polishing.

BACKGROUND ART

In recent years, there has been demanded a high flatness level for wafers, for example, thin disk-shaped wafers, such as a semiconductor silicon single crystal wafer (hereinafter also simply referred to as a silicon wafer), a glass substrate including a quartz wafer or others, a ceramic substrate including alumina, aluminum nitride or the like. A manufacturing process for the wafers, for example, a silicon wafer, comprises: a slicing step of slicing a cylindrical semiconductor ingot with a wire saw, a circular inner diameter blade or the like, to obtain thin disk-shaped wafers; a chamfering step of chamfering a peripheral edge portion of the wafer obtained through the slicing step to prevent chipping of the periphery thereof; a lapping step of lapping both surfaces of the chamfered wafer to adjust a thickness and flatness level thereof; an etching step of immersing the lapped wafer into an etching solution to etch all the surfaces thereof for removing processing damage remaining therein; and a polishing step of mirror polishing a single surface or both surfaces of the etched wafer for improving a surface roughness level and a flatness level thereof.

Furthermore, the chamfered portion of the above chamfered wafer is usually subjected to edge polishing prior to polishing the wafer for preventing particle generation upon contact thereof by handling or the like in later steps.

The edge polishing has been performed using a known edge polisher 10 as shown in FIGS. 12(*a*) and 12(*b*) (see JP A 99-188590). The edge polisher 10 has a rotary drum 12 and is of a structure that the drum 12 rotates about a rotary shaft 14 at a high speed. A multi- or single layer polishing cloth (a polishing pad) 16A (FIG. 12(*a*)) or 16B (FIG. 12(*b*)) is fixed on all the outer surface of the rotary drum 12.

18 designates a wafer rotating device, which is installed correspondingly to the rotary drum 12 and can freely change a tilt angle relative to the rotary drum 12. The wafer rotating device 18 includes a base 20, and a rotary shaft 22 rotatably installed on the top surface of the base 20. A wafer W is held on the top end of the rotary shaft 22 and subjected to edge polishing. 24 designates a nozzle, which supplies polishing slurry 26 to a contact portion of the polishing cloth 16 with the wafer W. Edge polishing is performed by polishing the chamfered portion of the wafer W with rotating both the rotary drum 12 and the wafer W, and pressing the wafer W to the polishing cloth 16 on the rotary drum 12 at a predetermined tilt angle, for example, in the range of from 40 degrees to 55 degrees relative to a polishing surface of the rotary drum.

In the above published patent application, as the polishing cloths (polishing pads) 16A and 16B, there was disclosed as prior art not only a polishing cloth (polishing pad) 16B (FIG. 12(*b*)) of a single layer structure, but also a polishing cloth (polishing pad) 16A of a two layer structure, that is, a multi-layer structure (FIG. 12(*a*)) constituted of a sheet 16*a* made of at least one of synthetic resin foam, nonwoven fabric, resin-treated nonwoven fabric, synthetic leather, or composites thereof; and an elastic sheet 16*b* such as a synthetic rubber sheet or a sponge sheet.

In the above edge polishing method, in order to increase a pressed-down amount into the polishing cloth (polishing pad) 16A or 16B, there are disclosed techniques using soft polishing cloths (for example, Suba 400 having a thickness of 1.27 mm and an Asker C hardness of 61 used in Comparative Example of the above published patent application; Suba 400 having a thickness of 1.27 mm+synthetic rubber having a thickness of 1 mm and a rubber hardness of 50 used in Example 1 of the published patent application; and Suba 400 having a thickness of 1.27 mm+sponge sheet used in Example 2 of the published patent application).

In the case where edge polishing is performed using a polishing cloth of the above noted structure, it has been found according to experiments by the present inventor that as shown in FIG. 13 a polished portion 32 is produced extending 500 μm or more into a wafer main surface from a wafer chamfered portion 30. In this specification, hereinafter, such excess polishing is referred to as over-polish and a width of the polished portion 32 is referred to as an over-polish width. The width of the wafer chamfered portion 30 is generally on the order of 500 μm. Therefore, the sum of the wafer chamfered portion 30 (about 500 μm) and the over-polish width 32 (about 500 μm) is about 1000 μm, that is, about 1 mm.

An edge exclusion area (E. E.) for flatness measurement on a wafer surface is currently 3 mm from the periphery of the wafer; therefore, if an over-polish width is about 500 μm, an influence thereof on wafer flatness is small. However, there have recently increased demands for the smallest possible edge exclusion area (E. E.) for wafer flatness measurement. This is for improving a yield of device chips obtainable from one wafer.

Generally, there has been a tendency that while a relatively high flatness level is achieved in a central portion of a wafer, a wafer thickness decreases from an inner position of about 5 mm from the wafer peripheral edge to the chamfered portion, which is referred to as a sag in the outer peripheral portion of the wafer. While causes of the wafer peripheral sag may be considered to be a difference between polishing pressures when polishing a wafer main surface, an influence of a polishing agent and so on, especially the sag generated at the boundary portion between the chamfered portion and the main surface is considered to be due to an influence of edge polishing.

For example, in case of an edge exclusion area (E. E.) for wafer flatness measurement of 1 mm, an over-polish width of about 500 μm would influence a wafer flatness level and generate a sag in the outer peripheral portion of the wafer.

DISCLOSURE OF THE INVENTION

The present inventor has performed various investigations to improve the above conventional edge polishing technique, as a result of which the present invention has been completed with the new findings on a novel over-polish width range enabling achievement of good wafer flatness with suppression of a wafer peripheral sag even in case of an edge exclusion area (E. E) for wafer flatness measurement of 1 mm, and a structure of a polishing cloth preferably used for manufacturing an edge polished wafer with the above novel over-polish width.

It is an object of the present invention to provide a novel edge polished wafer with a suppressed sag in the outer peripheral portion thereof, a polishing cloth for edge polishing which is used for manufacturing the novel edge polished wafer with good productivity and high efficiency, and an apparatus and method for edge polishing with the polishing cloth preferably used for edge polishing the above novel edge polished wafer.

In order to solve the above problem, in an edge polished wafer according to the present invention, an over-polish width generated by edge polishing is controlled to 400 μm or less.

In a wafer whose chamfered portion is mirror polished, by controlling the over-polish width to the range of the order of 0 to 400 μm, there can be attained a wafer with a high flatness level up close to the peripheral edge thereof through further polishing of the main surface thereof. While an over-polish width is preferably in a state of the perfect absence (zero), in order to perfectly turn the chamfered portion into a mirror-polished state taking into account variations in processing conditions, it is enough to manufacture an edge polished wafer with an over-polish width of the order of 50 μm. Moreover, in order to perfectly eliminate an influence of edge polishing under very strict conditions of an edge exclusion area (E. E) for wafer flatness measurement of 1 mm, an over-polish width is preferably in the range of from 50 μm to 200 μm.

Furthermore, while various methods are conceivable for manufacturing a wafer of the present invention, an especially preferable manufacturing apparatus and method are as follows: The wafer of the present invention may be manufactured using an apparatus comprising a rotary drum with a polishing cloth adhered on an outer surface thereof and a wafer rotating device holding and rotating a wafer, wherein the wafer is edge polished such that the wafer in rotation is put into contact with the polishing cloth at a prescribed angle thereto while supplying polishing slurry to the contact portion of the polishing cloth, and the contact portion (a polishing fabric layer) of the polishing cloth with the wafer has an Asker C hardness of 65 or higher. With contrivance on the polishing cloth in use, an over-polish width is reduced and thereby a wafer having an over-polish width of 400 μm or less can be produced stably.

Especially, a polishing cloth for edge polishing according to the present invention comprises at least two layers including a polishing fabric layer and a sponge layer having a hardness lower than the polishing fabric layer being laminated, wherein an Asker C hardness of the polishing fabric layer is 65 or higher and an Asker C hardness of the sponge layer is 40 or lower. It is especially preferable that the polishing fabric layer has a thickness of 1.3 mm or less and the sponge layer has a thickness of 1.0 mm or more. In addition, another polishing cloth according to the present invention may be of a single layer structure including only a polishing fabric layer having an Asker C hardness of 65 or higher, in which case a thickness of the polishing fabric layer is preferably 1.3 mm or less.

A wafer with an over-polish width of 400 μm or less can be obtained by the use of a polishing cloth having an Asker C hardness of 65 or higher. While the above wafer can be obtained using both polishing cloths of a single layer structure and a multilayer structure provided that a hardness of a contact portion of a polishing fabric layer with a wafer is the above value or higher, in case of the single layer structure the polishing fabric layer is hard; a contact area between the wafer and the polishing cloth in the peripheral direction is small. Consequently, it is necessary to rotate the wafer slowly in order to mirror-polish all the chamfered portion along the peripheral portion of the wafer, leading to a longer processing time and to poorer productivity. For this reason, an Asker C hardness of a polishing cloth of a single layer structure is preferably 78 or less.

In case of a polishing cloth structure of at least two layer including a polishing fabric layer and a sponge layer being laminated, wherein an Asker C hardness of the polishing fabric layer is 65 or higher and an Asker C hardness of the sponge layer is 40 or lower, a contact area toward the center of the wafer can be limited smaller, that is an over-polish width is controlled to 400 μm or less, while the contact area between the wafer and the polishing cloth in the peripheral direction can be large, thereby preferably, enabling reduction in time for mirror polishing all the chamfered portion of the wafer. Especially, by adjusting hardness and thickness of the sponge layer, an applicable upper limit of the polishing fabric layer is raised, so the polishing fabric layer with an Asker C hardness of 81 or higher, for example, can be used with almost no specific limitation provided that the polishing cloth has a hardness with which a mirror-finished surface is obtainable free of scratches and the like; processing can be performed with an extremely reduced over-polish width and good productivity. Note that while there is no specific limitation on an upper limit of the hardness of the polishing fabric layer, it is practically sufficient if the upper limit is an Asker C hardness of about 90. Moreover, while there is no specific limitation on a lower limit of the hardness of the sponge layer as well, it is practically sufficient if the lower limit is an Asker C hardness of about 10.

Thus, if the polishing cloth of the two layer structure is used to mirror polish the chamfered portion of the wafer, there can be obtained a longer contact length between the wafer and the polishing cloth in the wafer peripheral direction with a suppressed over-polish width, thereby improving polishing efficiency and increasing productivity. In this case, with an excessively thick polishing fabric layer, an effect from a sponge layer decreases; a thickness of the polishing fabric layer is preferably 1.3 mm or less. With the thickness of 0.5 mm or less, a lifetime of the polishing cloth is shorter to thereby increase the frequency of exchanging the polishing cloths, so the thickness is preferably on the order of 1.3 mm to 0.7 mm. A thickness of the sponge layer is preferably 1 mm or more. If the thickness is less than 1 mm, it reduces an effect of making larger of the contact area between the wafer and the polishing cloth along the periphery thereof. Contrary to this, if the thickness is excessively large, it is difficult to adhere the polishing cloth around the rotary drum; therefore the thickness is preferably on the order of 1 mm to 2 mm.

As described above, the edge polished wafer can be preferably manufactured using the apparatus with the polishing cloth having an Asker C hardness of 65 or higher under processing conditions (an edge polishing method) that a polishing load is 2 kgf or more and a tilt angle of the wafer against the polishing cloth is in the range of from 40 degrees to 55 degrees. Note that the tilt angle of the wafer against the polishing cloth means an angle formed between the normal of the polishing cloth and the wafer and if the tilt angle is less than 40 degrees, non-processing easily occurs in a boundary portion between the chamfered portion and a main surface of the wafer; while more than 55 degrees, an over-polish width is larger and non-processing further easily occurs in the outermost peripheral portion of the wafer.

In order to control an over-polish width to 400 μm or less using a conventional relatively soft polishing cloth (an Asker C hardness of about 60), a method is conceivable that the lowest possible polishing load is applied. In this condition, however, there arise inconveniences that a non-polished portion is left and that it takes an extremely long time for edge polishing. In order to perform efficient edge polishing with the above apparatus in view of productivity, it is preferable that a polishing load is 2 kgf or more, and a tilt angle of the wafer against the polishing cloth is in the range of from 40 degrees to 50 degrees. Furthermore, the above efficient edge polishing may be achieved easily by adopting the polishing cloth having an Asker C hardness of 65 degrees or more.

While no specific limitation is imposed on an upper limit of a polishing load, it is only required that a sinking amount of a wafer into a polishing cloth is confirmed depending on hardness of the polishing cloth and thereafter, the polishing load is properly determined so as to adjust an over-polish width to 400 μm or less. Practically, the upper limit of the polishing load may be on the order of 5 kgf.

BEST MODE FOR CARRYING OUT THE INVENTION

Description will be given of one embodiment of the present invention below based on the accompanying drawings. It is needless to say that examples shown in the figures are presented by way of illustration and various changes and modifications of the examples may be made without departing from the technical concept of the present invention.

Figure 1:
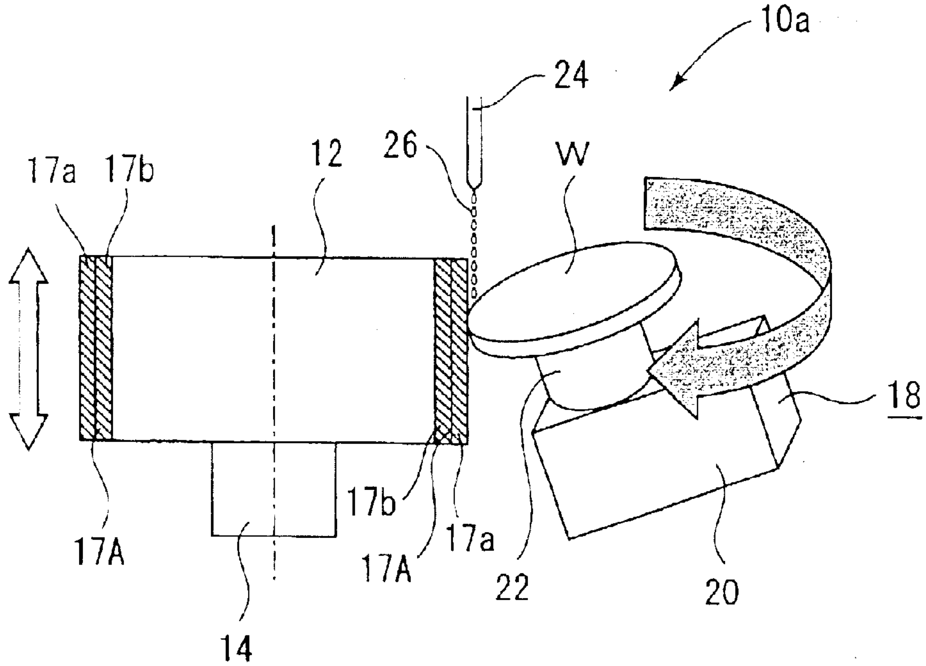
FIG. 1 is a descriptive illustration showing an example of a polishing apparatus for edge polishing according to the present invention, wherein a part (a) shows the apparatus with a polishing cloth of a multilayer structure and a part (b) shows the apparatus with a polishing cloth of a single layer structure.
Figure 1:
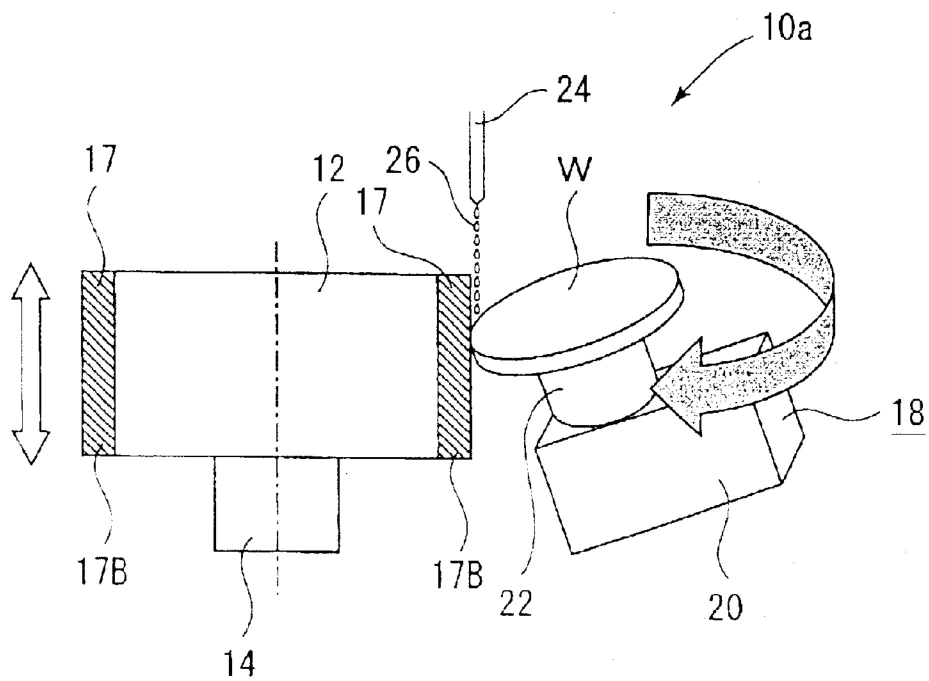
Figure 12:
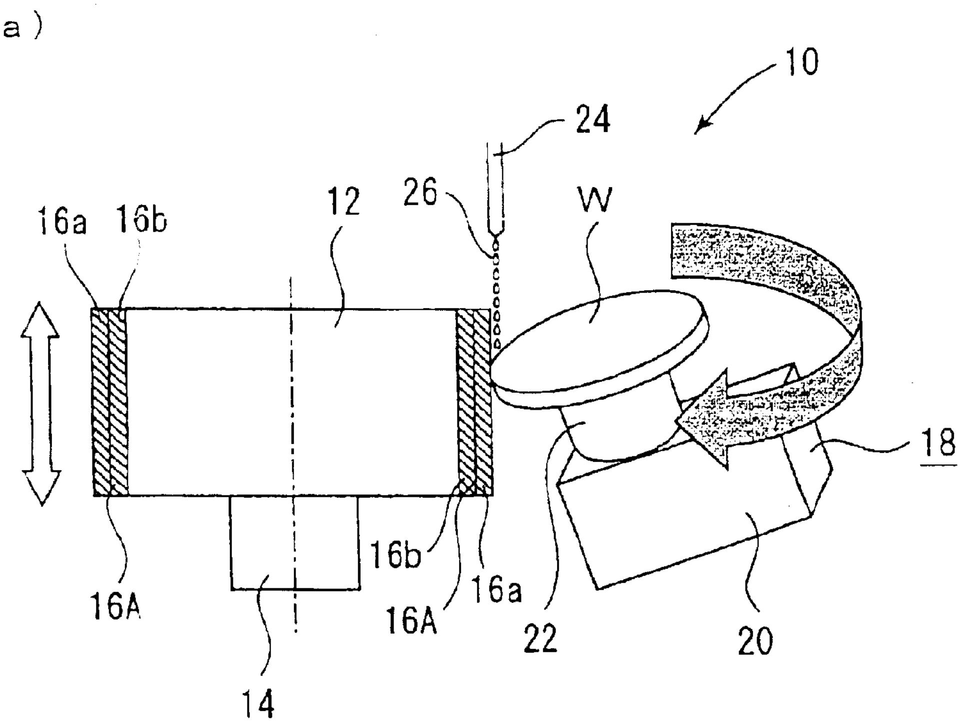
FIG. 12 is a descriptive illustration showing an example of a prior art edge polishing apparatus, wherein a part (a) shows the apparatus with a polishing cloth of a multilayer structure and a part (b) shows the apparatus with a polishing cloth of a single layer structure.
Figure 12:
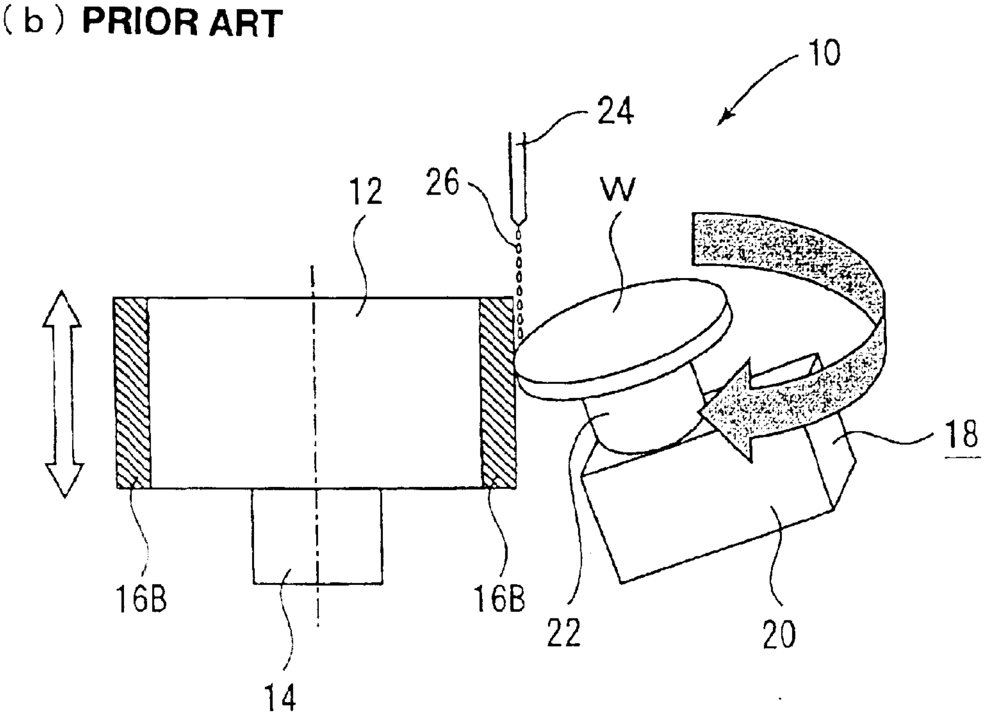
Figure 13:
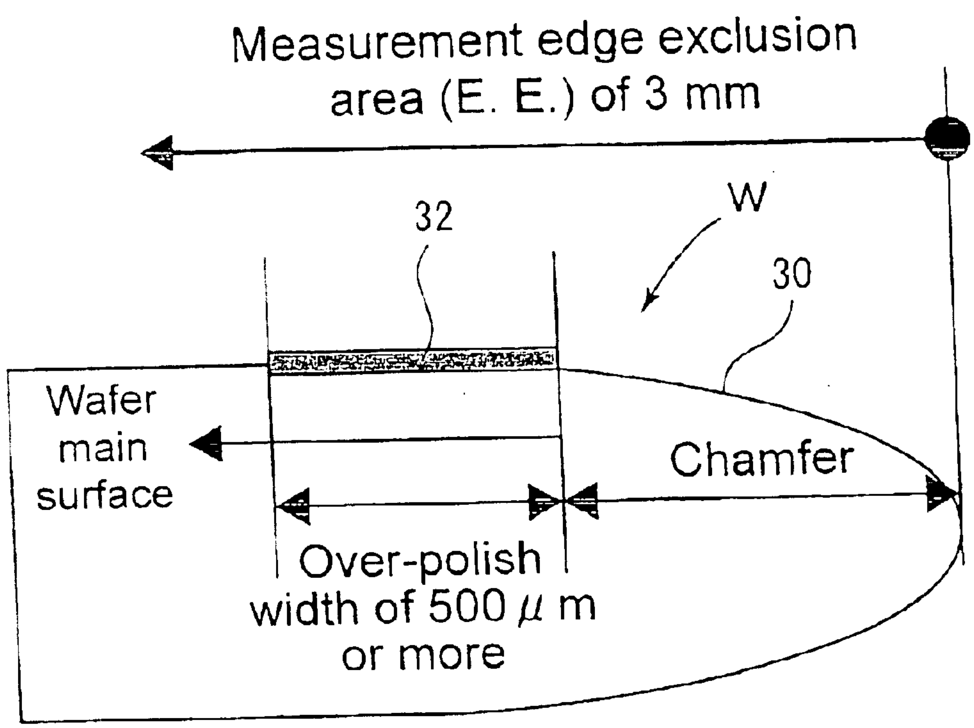
FIG. 13 is a descriptive illustration of a main part of a prior art edge polished wafer.

FIG. 1 shows an edge polishing apparatus 10*a* according to the present invention, which is similar to the prior art apparatus 10 shown in FIG. 12 in terms of basic construction, but is different therefrom in that there are used polishing cloths (polishing pads) 17A and 17B different in structure, especially hardness, instead of the prior art polishing cloths (polishing pads) 16A and 16B. Therefore, there is not repeated the second description on the points other than the polishing cloths. In FIG. 1, the same or similar reference symbols are used to designate the same or similar members.

In JP A 99-188590 described above as well, there are shown an example of a polishing cloth (polishing pad) of a single layer structure (FIG. 12(*b*)) and an example of that of a multi-layer structure constituted of two sheets (FIG. 12(*a*)). As described above, however, in the published patent application there is disclosed neither necessity for controlling an over-polish width of a chamfer in processing a main surface of a wafer to a high flatness level, nor teachings of a preferable hardness of the polishing cloth 16B of a single layer structure for reaching the solution of how to control the over-polish width, of a preferable range in hardness of the sheets 16*a* and 16*b* constituting the polishing pad 16A of a multilayer structure, and of the distribution ratio in hardness between the sheets 16*a* and 16*b*.

That is, the polishing cloth 17A for edge polishing of the present invention is clearly differentiated from the polishing pad 16A of a multilayer structure described in the published patent application, in that the polishing cloth 17A is, as shown in FIG. 1(*a*), of a multilayer structure constituted of at least two layers, an outer polishing fabric layer 17*a* and an inner sponge layer 17*b*, and by specifying hardness of each of the layers in the respective prescribed ranges, good edge polishing (with an over-polish width of 400 μm or less) is enabled.

It is necessary that the polishing fabric layer 17*a* is made of non-woven fabric, resin-treated non-woven fabric, synthetic resin foam or synthetic leather, or a composite thereof and hardness thereof is an Asker C hardness of 65 or higher and preferably 68 or higher; to be detailed, preferably used are Suba 400 H (an Asker C hardness of 68), Suba 600 (an Asker C hardness of 78), Suba 800 (an Asker C hardness of 81) made by Rodel Nitta Company and others.

Herein, an Asker C hardness indicating hardness of a polishing cloth and a sponge member is a value measured with an Asker C type rubber hardness meter, one kind of a spring hardness tester. This is a value in accordance with SRIS 0101, which is a standard of the Society of Rubber Industry, Japan.

Materials used in the sponge layer are not limited in a specific way but should have flexibility to be attachable to the rotary drum and hardness of 40 or less in terms of an Asker C hardness. For example, sponge-like silicone referred to as a silicone rubber sponge or simply, a silicone sponge, or the like material may be preferably used. Furthermore, the sponge layer is not limited to such sponge foam materials, and besides the foam materials there may be used elastically deformable materials whose hardness falls in a desired range. Note that while the lower limit of hardness of the sponge layer is not specified either, it should be practically on the order of 10 in terms of an Asker C hardness.

The sponge layer 17*b* is set lower than the polishing fabric layer 17*a* in terms of hardness and required to be of an Asker C hardness of 40 or lower. The polishing fabric layer 17*a* is preferably 1.3 mm or less in thickness and the sponge layer 17*b* is preferably 1.0 mm or more in thickness.

Moreover, the polishing cloth 17B for edge polishing is, as shown in FIG. 1(*b*), of a single layer structure constituted of a polishing fabric layer 17 alone, but is distinctly differentiated from the polishing pad 16B of a single layer structure described in the above published patent application in that by specifying hardness of the polishing fabric layer in a prescribed range, good edge polishing treatment (with an over-polish width of 400 μm or less) is enabled. As materials of a polishing fabric layer of the polishing cloth 17B for edge polishing, those similar to the above polishing fabric layer 17*a* may be applied.

Figure 2:
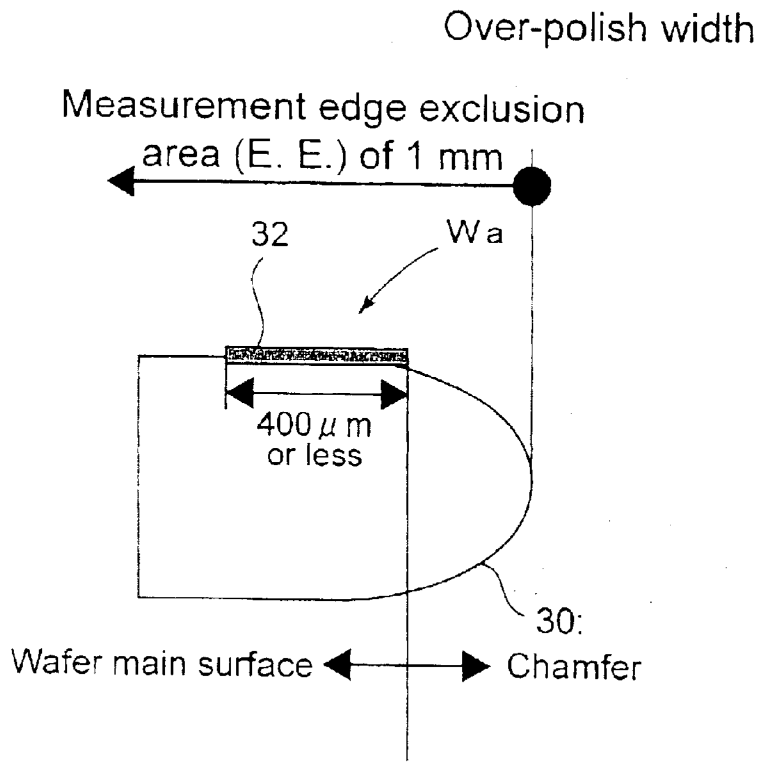
FIG. 2 is a descriptive illustration of a main part of an edge polished wafer of the present invention.

In an edge polished wafer Wa according to the present invention, an over-polish width 32 caused by edge polishing is controlled to 400 μm or less as shown in FIG. 2. With such a structure, even when an edge exclusion area (E. E) for measurement on a wafer surface is 1 mm, the sum of the chamfer (500 μm) and the over-polish width (400 μm or less) is 900 μm or less; therefore, no peripheral sag is generated so that flatness of the wafer is not affected thereby.

In order to manufacture an edge polished wafer Wa according to the present invention by the use of the polishing apparatus 10*a* with the polishing cloth 17A or 17B for edge polishing according to the present invention, edge polishing is performed in conditions that a polishing load is 2 kgf or more and a tilt angle of the wafer to the polishing cloth 17 is in the range of from 40 degrees to 55 degrees. Note that the tilt angle of the wafer against the polishing cloth 17 means an angle formed between the normal of the polishing cloth surface and the wafer.

By edge polishing under a pressure of 2 kgf or more in terms of a polishing load, a stock removal can be increased, with the result that edge polishing can be stably performed even in a short time without leaving any unpolished portion. While no specific limitation is imposed on an upper limit of the polishing load, it is sufficient practically if a value of the order of 5 kgf is set to the upper limit. Furthermore, by setting a tilt angle in the range of from 40 degrees to 55 degrees, a sloping section and a leading edge section of a chamfer are simultaneously polished to be effectively edge polished so that the working time may be reduced and the productivity may be increased. If the tilt angle is less than 40 degrees, non-processing is easy to occur in a boundary portion between the chamfer and a main surface, while on the other hand, if exceeding 55 degrees, an over-polish width increases and further non-processing is easy to occur in the outermost peripheral section of the wafer.

Figure 3:
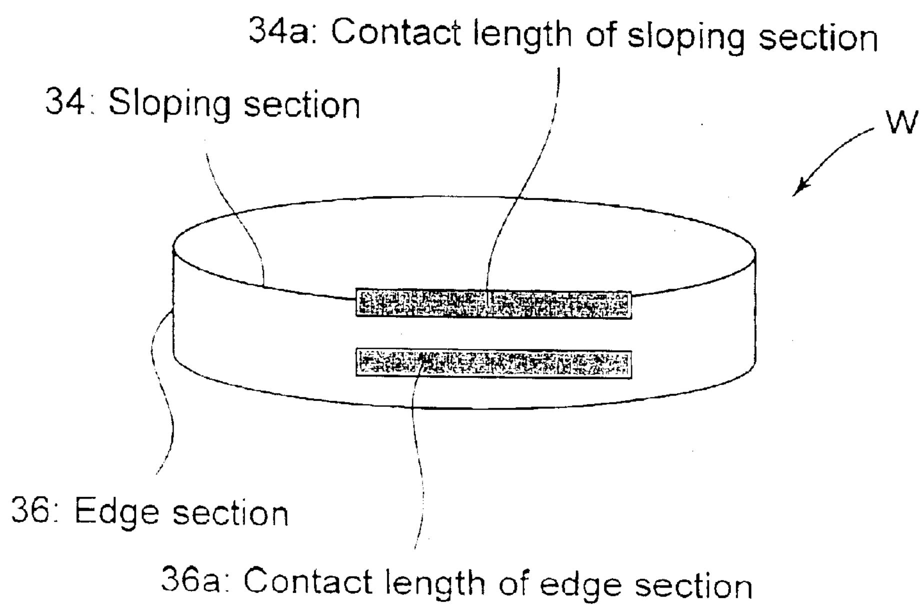
FIG. 3 is a perspective illustration showing a wafer in an exaggerated form.

FIG. 3 is a perspective illustration showing a wafer W in an exaggerated form, wherein a reference numeral 34 indicates a portion in the vicinity of the main surface of the wafer W referred to as a sloping section and a reference numeral 36 indicates a portion in the vicinity of the outermost periphery thereof referred to as a leading edge section. A reference numeral 34*a* indicates a contact length between the sloping section 34 and the polishing cloth 17 and a reference numeral 36*a* indicates a contact length between the leading edge section 36 and the polishing cloth 17. The longer the contact lengths 34*a* and 36*a* are, the shorter the polishing time becomes; it is expected to improve a polishing efficiency to that extent.

While description will be given of the present invention in a more detailed manner taking up examples, it is needless to say that the examples are presented by way of illustration and should not be construed by way of limitation.

EXAMPLES 1 TO 4 AND COMPARATIVE EXAMPLES 1 TO 3

As specimen wafers, there were used wafers obtained by chamfering peripheral sections of wafers with a diameter of 200 mm and a crystal axis orientation of <100>, followed by etching. A chamfer of each specimen wafer is subjected to edge polishing using one of 7 kinds of polishing cloths shown in Table 1 in an edge polishing apparatus as shown in FIG. 1, respectively.

TABLE 1

| Processing conditions | | | |
|---|---|---|---|
| Polishing load | 2.5 kgf | | |
| Drum rotation speed | 800 rpm | | |
| Tilt angle of a stage | 45° | | |
| Polishing time | 150 sec. (time required for one rotation of a wafer) | | |
| Polishing cloth | Single layer cloth | Comparative Example 1 | Suba-Lite |
| | | Comparative Example 2 | Suba 400 |
| | | Example 4 | Suba 600 |
| | Multilayer cloth | Example 1 | Suba 400H + Sponge member |
| | | Example 2 | Suba 600 + Sponge member |
| | | Example 3 | Suba 800 + Sponge member |
| | | Comparative Example 3 | Suba 400 + Sponge member |

Hardness and thickness of polishing cloths and sponge members (silicone sponge) shown in Table 1 are as follows:

Suba-Lite (made by Rodel Nitta Company): an Asker C hardness of 53 and a thickness of 1.27 mm Suba 400 (made by Rodel Nitta Company): an Asker C hardness of 61 and a thickness of 1.27 mm Suba 400 H (made by Rodel Nitta Company): an Asker C hardness of 68 and a thickness of 1.27 mm Suba 600 (made by Rodel Nitta Company): an Asker C hardness of 78 and a thickness of 1.27 mm Suba 800 (made by Rodel Nitta Company): an Asker C hardness of 81 and a thickness of 1.27 mm Sponge member: an Asker C hardness of 35 and a thickness of 1.0 mm In Table 2 there are shown over-polish widths of the specimen wafers subjected to edge polishing with polishing cloths. The over-polish width was obtained by performing observation on a magnified image of an outermost peripheral section (a chamfer) of each of the specimen wafers with a video microscope to evaluate a width (length) of a mirror polished portion on a main surface thereof, using a boundary between the chamfer and the outermost periphery of the main surface as reference.

TABLE 2

| | Kinds of polishing cloths | Over-polish widths |
|---|---|---|
| Comparative Example 1 | Suba-Lite | 600 μm ± 50 μm |
| Comparative Example 2 | Suba 400 | 500 μm ± 50 μm |
| Comparative Example 3 | Suba 400 + Sponge member | 500 μm ± 50 μm |
| Example 1 | Suba 400H + Sponge member | 400 μm ± 20 μm |
| Example 2 | Suba 600 + Sponge member | 200 μm ± 20 μm |
| Example 3 | Suba 800 + Sponge member | 100 μm ± 20 μm |
| Example 4 | Suba 600 | 150 μm ± 20 μm |

The results of edge polishing show the fact that even if the same condition is applied when hardness of the polishing cloth is low, the over polish width is varied easily. In case of an Asker C hardness of 65 or lower, the variation of the over-polish width was on the order of ±50 μm or more. On the other hand, in case of an Asker C hardness of 65 or higher, it was possible to restrain the variation of the over-polish width to the level of the order of ±20 μm.

Then, the edge polished specimen wafers were each subjected to usual polishing on a main surface thereof using a single wafer polishing machine with a polishing cloth of a non-woven fabric type and a polishing agent containing colloidal silica, a stock removal thereof being 10 μm. A cross section and site flatness (SFQR: a cell size of 25×25 mm at an E.E. of 1 mm) of the wafer were measured with an optical non-contact flatness measuring device.

The term SFQR (Site Front least-sQuare Range) is a value indicating the biggest range of the unevenness against an average surface of a front side reference that was calculated at each site (cell) with reference to flatness.

Figure 4:
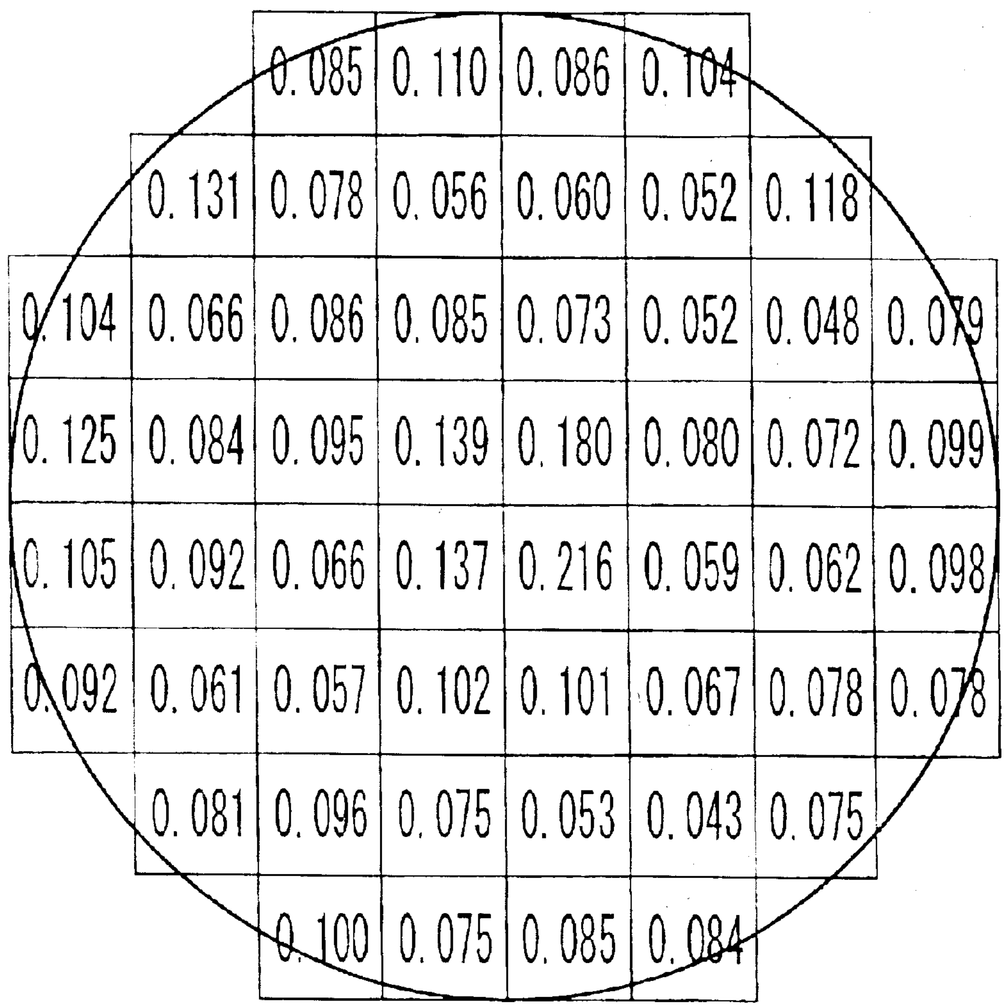
FIG. 4 is a site map of a specimen wafer edge polished in Example 3.
Figure 5:
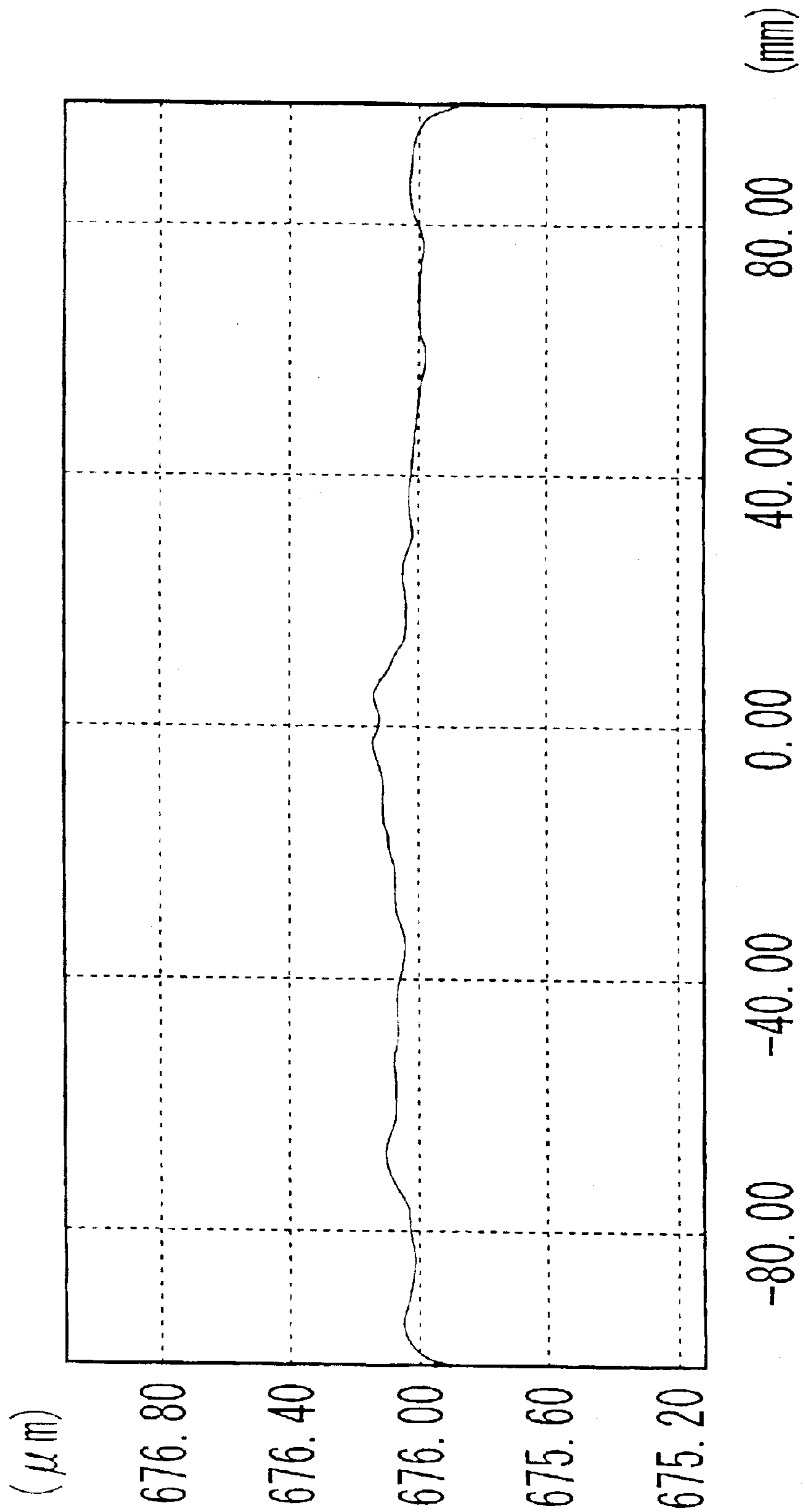
FIG. 5 is a cross sectional profile of the specimen wafer edge polished in Example 3.

In FIGS. 4 and 5 there are shown a site map and a cross section in terms of flatness in Example 3 (Suba 800+Sponge member), respectively. As is apparent from FIG. 4, bad sites in Example 3 were 1⁄52=2%, a good site yield being 98%. In Example 3, it was confirmed, as shown well in FIG. 5, that no peripheral sag was perfectly generated. The good site herein means a site where SFQR is 0.18 μm or less.

Figure 6:
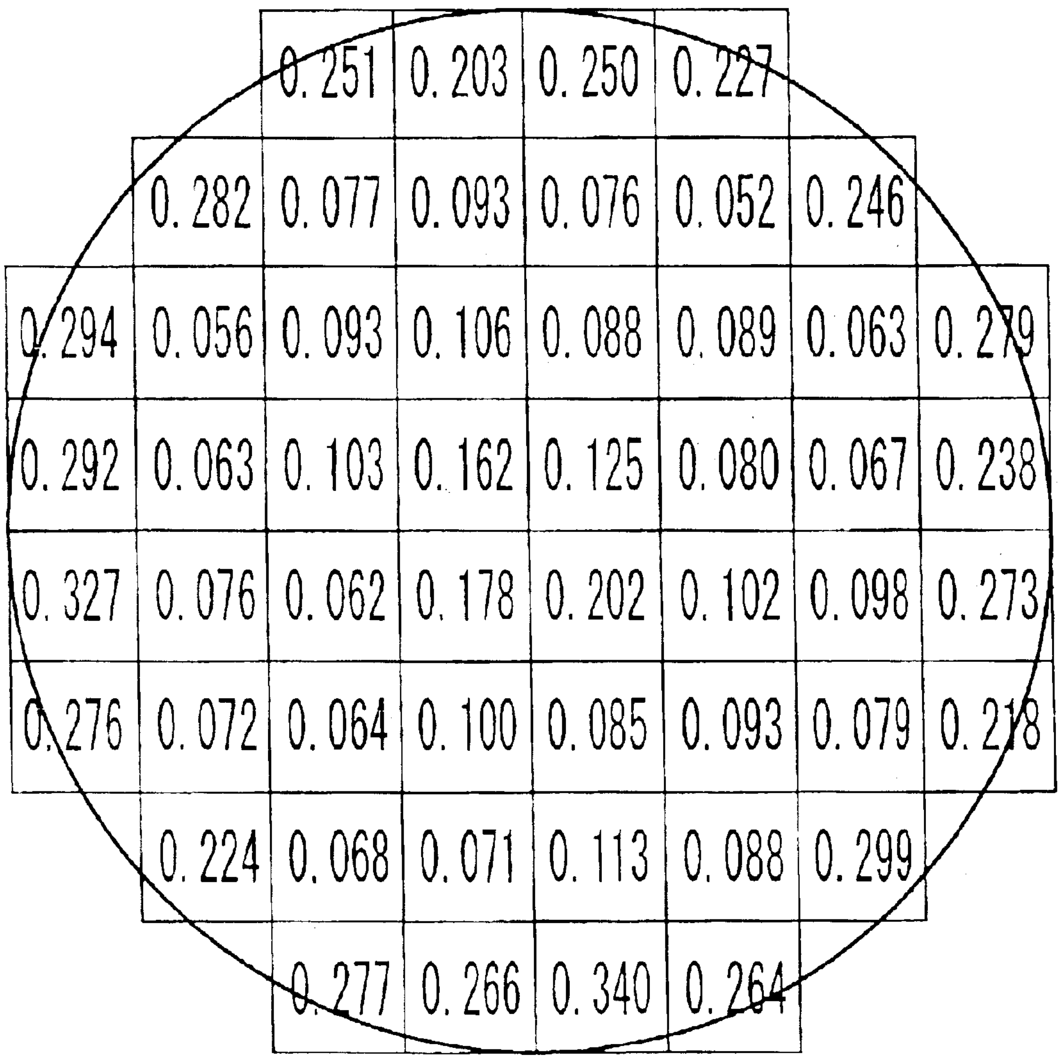
FIG. 6 is a site map of a specimen wafer edge polished in Comparative Example 2.
Figure 7:
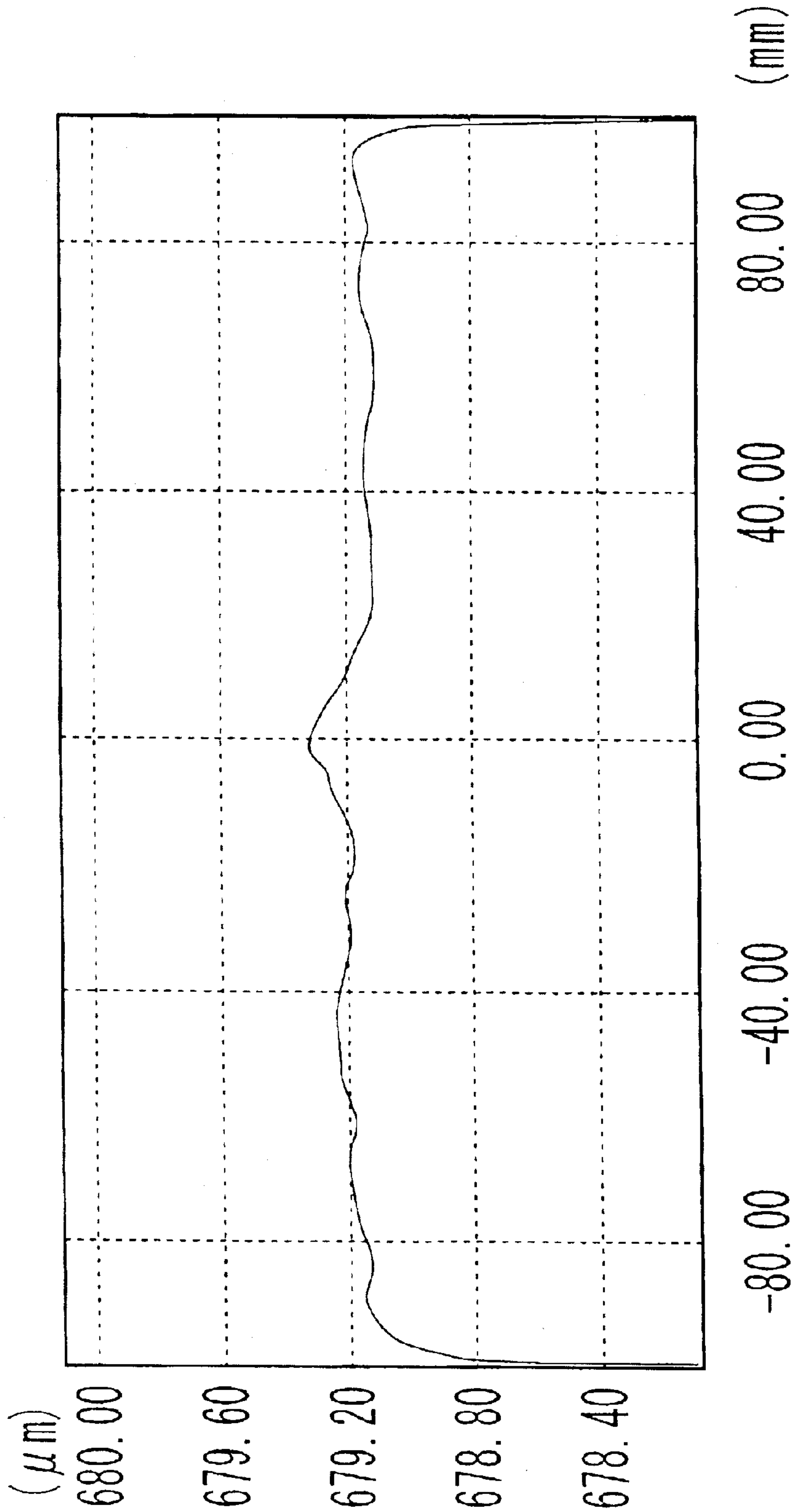
FIG. 7 is a cross section of the specimen wafer edge polished in Comparative Example 2.

Furthermore, in FIGS. 6 and 7 there are shown a site map and a cross section in terms of flatness in Comparative Example 2 (Suba 400). As is apparent from FIG. 6, bad sites in Comparative Example 2 were 21⁄52=40%, a good site yield being 60%. In Comparative Example 2, it was confirmed, as shown well in FIG. 7, that a peripheral sag was generated.

Figure 8:
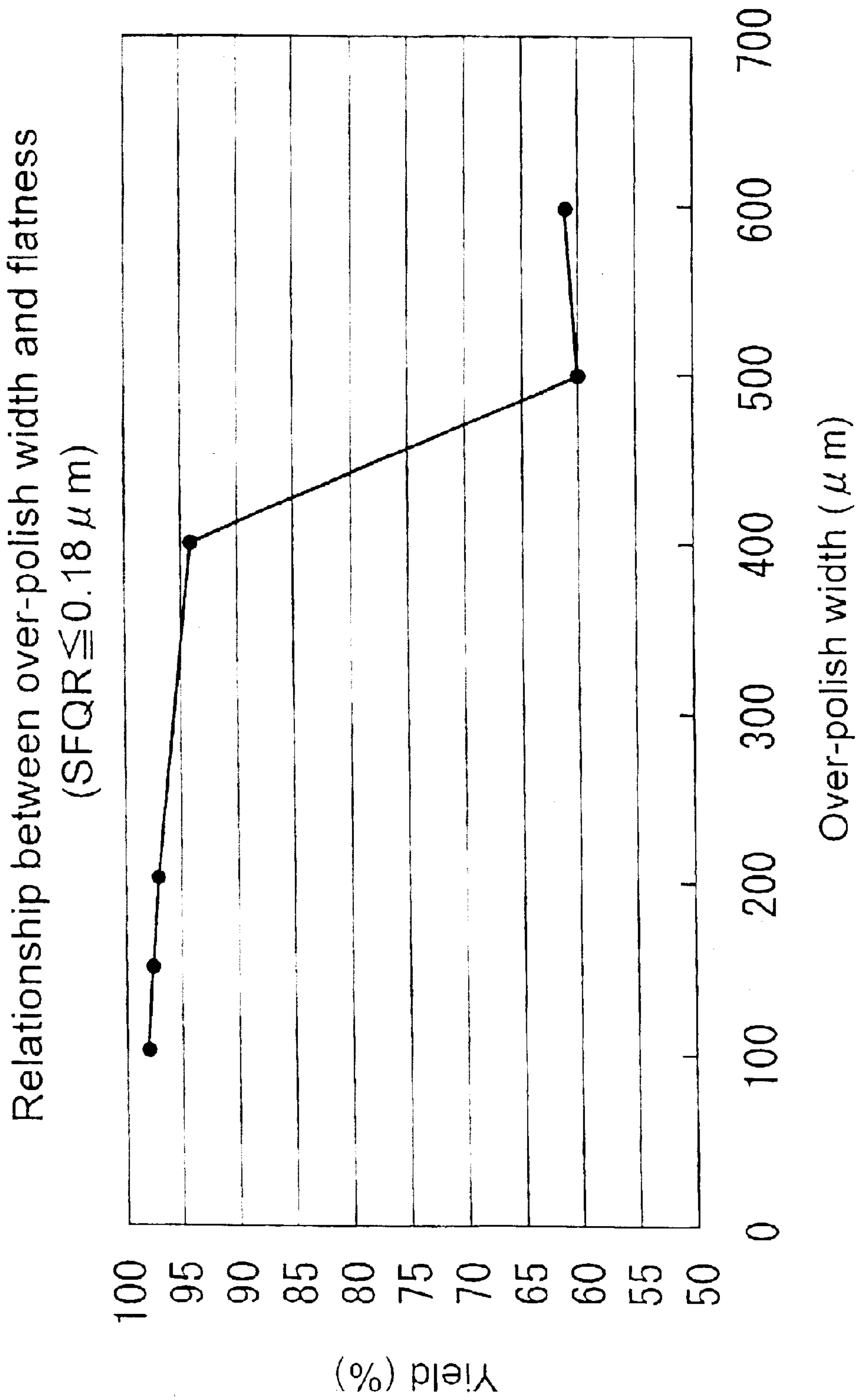
FIG. 8 is a graph showing results of values of site flatness measured at E.E. of 1 mm in Examples 1 to 4 and Comparative Examples 1 to 3.

In FIG. 8 there are shown results of site flatness in Examples 1 to 4 and Comparative Examples 1 to 3 measured at an E.E. of 1 mm. In FIG. 8, an over-polish width is assigned to the abscissa and a good site yield relative to a standard of flatness SFQR≦0.18 μm is assigned to the ordinate. It was confirmed that at an E.E. of 1 mm with a standard of flatness SFQR≦0.18 μm, a good site yield of site flatness was about 60% at an over-polish width of 500 μm or more, for example, a good site yield of site flatness was 62% at an over-polish width of 600 μm and a good site yield of site flatness was about 60% at an over-polish width of 500 μm, while with a controlled over-polish width of 400 μm or less, a good site yield was improved to 90% or more.

That is, SFQR values are almost all 0.18 μm or less across a surface of a wafer; therefore, it is essential to improve a good site yield in a wafer peripheral section for increasing a good site yield, which can be achieved by controlling an over polish width. It was confirmed that by changing kinds of polishing cloths used in edge polishing, an over-polish width was able to be controlled to 400 μm or less, which is a value greatly lowered from 500 μm achieved by the use of the polishing cloth Suba 400 (Comparative Example 2) that is mainly used in the current practice.

Moreover, in measurement at an E.E. of 1 mm, a peripheral sag was observed in the wafer peripheral section in case of an over-polish width of 500 μm. Even in measurement at an E. E. of 2 mm, a good site yield sometimes decreased when an over-polish width was on the order of from 500 to 600 μm. This is considered because a polishing agent easily intrudes into an over polished portion which is excessively polished, with the result that the main surface of the wafer is affected up to a portion in the vicinity of 2 mm from the periphery thereof, although this is dependent on an operating condition for polishing the main surface. In case of an over-polish width of 150 μm, however, the above noted trend was not observed.

EXAMPLES 5 TO 19 AND COMPARATIVE EXAMPLES 4 TO 6

As specimen wafers, there were used wafers obtained by chamfering peripheral sections of wafers with a diameter of 200 mm and with a crystal axis orientation of <100>, followed by etching. Processing conditions for edge polishing were as follows: six kinds of polishing cloths shown in Table 3 were used, three levels of polishing loads were adopted, 2 kgf (Examples 5, 8, 11, 14 and 17, and Comparative Example 4), 2.5 kgf (Examples 6, 9, 12, 15 and 18, and Comparative Example 5), and 3 kgf (Examples 7, 10, 13, 16 and 19, and Comparative Example 6), and edge polishing was performed with a edge polishing apparatus as shown in FIG. 1.

TABLE 3

| Processing conditions | | | |
|---|---|---|---|
| Polishing loads | 2 kgf, 2.5 kgf, 3 kgf | | |
| Drum rotation speed | 800 rpm | | |
| Tilt angle of a stage | 45° | | |
| Polishing time | A wafer was polished for 10 sec. at a fixed position without rotation | | |
| Polishing cloth | Single layer cloth | Comparative Examples 4 to 6 | Suba 400 (1.27 mm) |
| | | Examples 5 to 7 | Suba 600 (1.27 mm) |
| | Multilayer cloth | Examples 8 to 10 | Suba 600 (0.7 mm) + Sponge member (2 mm) |
| | | Examples 11 to 13 | Suba 600 (1.27 mm) + Sponge member (2 mm) |
| | | Examples 14 to 16 | Suba 600 (0.7 mm) + Sponge member (1 mm) |
| | | Examples 17 to 19 | Suba 800 (0.7 mm) + Sponge member (2 mm) |

Values of hardness of polishing cloths and sponge members (silicone sponge) used in Table 3 were the same as those described above. Measurement was performed on an over-polish width of each of the edge polished specimen wafers, and contact lengths of the sloping section and the edge section shown in FIG. 3, the results of which are shown in FIGS. 9 to 11, respectively.

Figure 9:
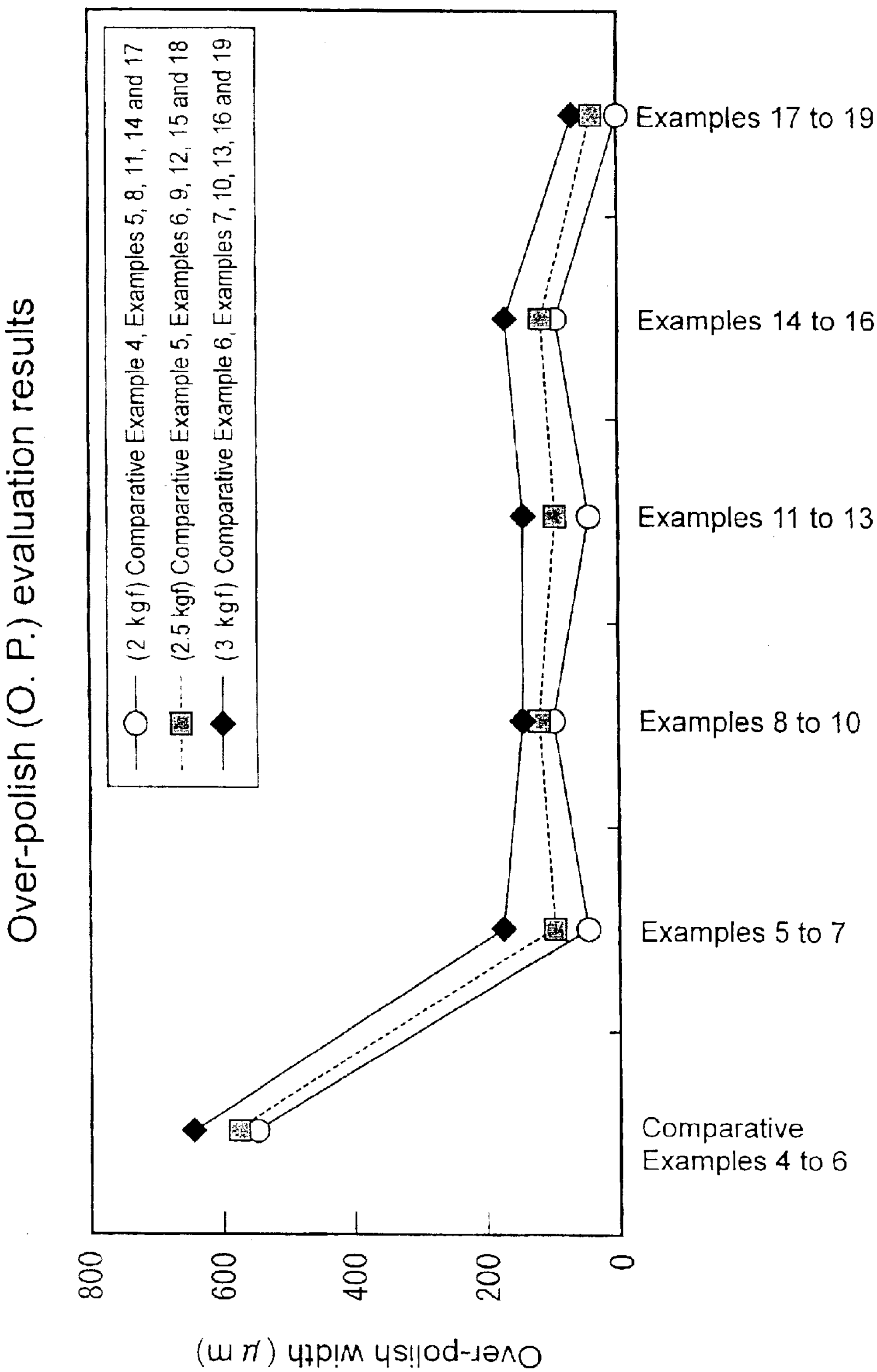
FIG. 9 is a graph showing evaluation results of over-polish widths in Examples 5 to 19 and Comparative Examples 4 to 6.

As is apparent from FIG. 9, in edge polishing with a soft polishing cloth (Suba 400) of a single layer structure, over-polish widths of specimen wafers were 500 μm or more for any of polishing loads, while when a polishing cloth falls within a range of hardness conditions for a polishing cloth of the present invention, an over-polish width of each specimen wafer was able to be controlled to 400 μm or less with any of polishing cloths of a multilayer structure (Examples 8 to 19) and a single layer structure (Examples 5 to 7). Moreover, it was confirmed that even when the polishing load was changed and when thickness of each layer of the polishing cloth was changed, using any of the polishing cloths according to the present invention the over-polish width can be controlled to 400 μm or less.

Figure 10:
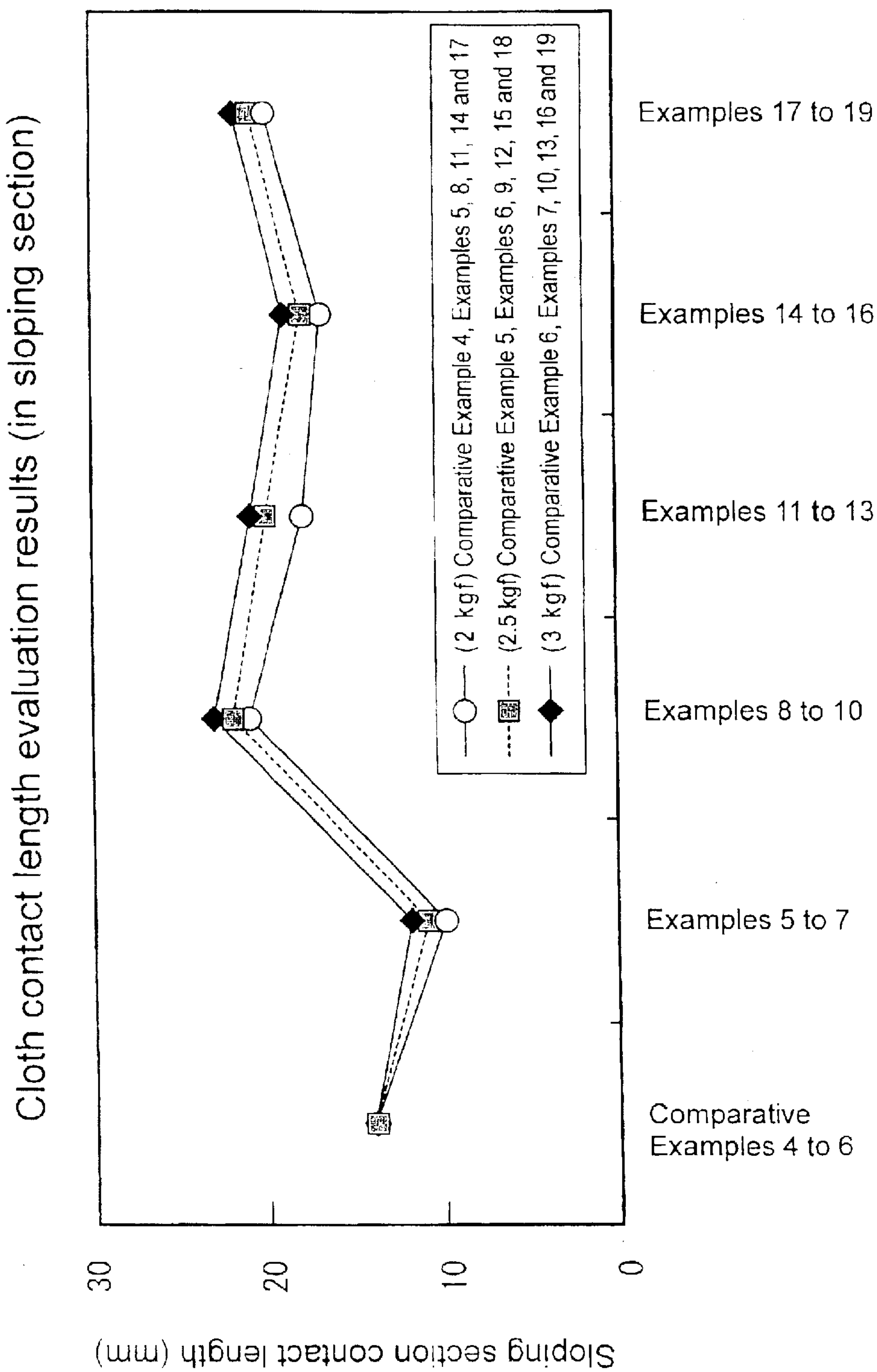
FIG. 10 is a graph showing evaluation results of contact lengths of sloping sections in Examples 5 to 19 and Comparative Examples 4 to 6.
Figure 11:
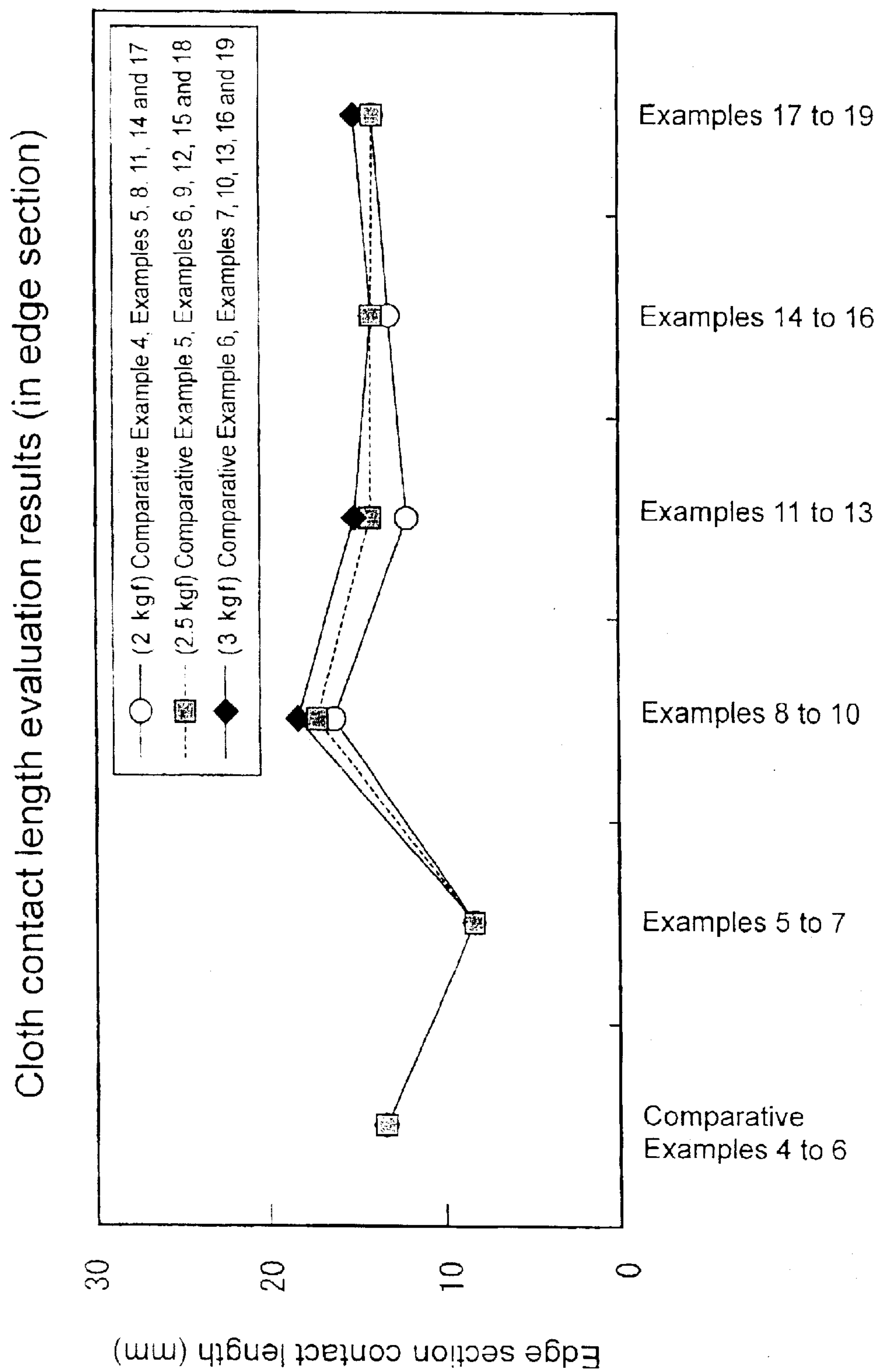
FIG. 11 is a graph showing evaluation results of contact lengths of edge sections in Examples 5 to 19 and Comparative Examples 4 to 6.

Furthermore, as shown in FIGS. 10 and 11, in the polishing cloths of a multilayer structure according to the present invention (Examples 8 to 19), the contact lengths of the sloping section and the edge section are both longer than those in the polishing cloths of a single structure (Examples 5 to 7 and Comparative Examples 4 to 6); when a rotational frequency of the polishing cloth (the rotary drum) and a rotation speed of the wafer are both constant, the polishing rate are increased. Therefore, it can be seen that a time required for edge polishing is reduced to that extent so that the polishing efficiency is advantageously improved.

On the other hand, in the polishing cloths of a single structure according to the present invention (Examples 5 to 7), the contact lengths of the sloping section and the edge section are both shorter than those in the polishing cloths of a multilayer structure (Examples 8 to 19); a time required for edge polishing is disadvantageously longer to that extent, whereas there is no change in that an over-polish width is controlled to 400 μm or less.

Note that the present invention is not limited to the above embodiment. While in the above Examples, description is given of the present invention taking up silicon wafers as examples, the present invention can be applied in a similar way to any other wafers such as a quartz wafer and a ceramic substrate wherein high flatness is required, the peripheral section is chamfered, and further edge polishing is necessary for preventing particle generation from the chamfer (for improving surface roughness of the chamfer).

CAPABILITY OF EXPLOITATION IN INDUSTRY:

As described above, an edge polished wafer of the present invention is capable of suppression of a wafer peripheral sag and achievement of good flatness. By the use of a polishing cloth for edge polishing of the present invention, there can be efficiently manufactured an edge polished wafer having an over-polish width controlled to 400 μm or less. Furthermore, with an apparatus for edge polishing provided with a polishing cloth for edge polishing of the present invention and a method for edge polishing using the apparatus, an edge polished wafer of the present invention can be efficiently manufactured.

What is claimed is:

1. A polishing cloth for edge polishing comprising a multi-layer structure of at least two layers including a polishing fabric layer and a sponge layer having a hardness lower than the polishing fabric layer being laminated, wherein an Asker C hardness of the polishing fabric layer is 65 or higher and an Asker C hardness of the sponge layer is 40 or lower.

2. The polishing cloth for edge polishing according to claim 1, wherein the polishing fabric layer has a thickness of 1.3 mm or less and the sponge layer has a thickness of 1.0 mm or more.

3. An apparatus for edge polishing comprising a rotary drum with a polishing cloth adhered on an outer surface thereof and a wafer rotating device holding and rotating a wafer, wherein the wafer is edge polished such that the wafer in rotation is put into contact with the polishing cloth at a prescribed angle thereto while supplying polishing slurry to the contact portion of the polishing cloth, the polishing cloth in use being the polishing cloth for edge polishing according to claim 1.

4. An apparatus for edge polishing comprising a rotary drum with a polishing cloth adhered on an outer surface thereof and a wafer rotating device holding and rotating a wafer, wherein the wafer is edge polished such that the wafer in rotation is put into contact with the polishing cloth at a prescribed angle thereto while supplying polishing slurry to the contact portion of the polishing cloth, the polishing cloth in use being the polishing cloth for edge polishing according to claim 2.

5. An apparatus for edge polishing comprising a rotary drum with a polishing cloth adhered on an outer surface thereof and a wafer rotating device holding and rotating a wafer, wherein the wafer is edge polished such that the wafer in rotation is put into contact with the polishing cloth at a prescribed angle thereto while supplying polishing slurry to the contact portion of the polishing cloth, the polishing cloth being of a single layer structure including only a polishing fabric layer having an Asker C hardness of 65 or higher.

6. An apparatus for edge polishing according to claim 5, wherein a thickness of the polishing fabric layer is 1.3 mm or less.

7. A method for edge polishing a wafer having a chamfered portion, comprising the steps of: edge polishing the chamfered portion while controlling an over-polish width to 400 μm or less wherein edge polishing is achieved by using one of a polishing cloth comprising a multi-layer structure of at least two layers including a polishing fabric layer and a sponge layer having a hardness lower than the polishing fabric layer being laminated with an Asker C hardness of the polishing fabric layer of 65 or higher and an Asker C hardness of the sponge layer of 40 or lower and a polishing cloth comprising a single layer structure including only a polishing fabric layer having an Asker C hardness of 65 or higher and wherein a chamfered portion of a wafer is edge polished while controlling an over-polish width to 400 μm or less.

8. A method for edge polishing according to claim 7, wherein the chamfer portion is edge polished such that a polishing load is 2 kgf or more, a tilt angle of the wafer against the polishing cloth is in the range of from 40 degrees to 55 degrees using an apparatus according to claim 3.

9. A method for edge polishing according to claim 7, wherein the chamfer portion is edge polished such that a polishing load is 2 kgf or more, a tilt angle of the wafer against the polishing cloth is in the range of from 40 degrees to 55 degrees using an apparatus according to claim 4.

10. A method for edge polishing according to claim 7, wherein the chamfer portion is edge polished such that a polishing load is 2 kgf or more, a tilt angle of the wafer against the polishing cloth is in the range of from 40 degrees to 55 degrees using an apparatus according to claim 5.

11. A method for edge polishing according to claim 7, wherein the chamfer portion is edge polished such that a polishing load is 2 kgf or more, a tilt angle of the wafer against the polishing cloth is in the range of from 40 degrees to 55 degrees using an apparatus according to claim 6.

* * * * *